United States Patent [19]

Germer et al.

[11] Patent Number: 4,761,606

[45] Date of Patent: Aug. 2, 1988

[54] AUTO-RANGING IN ELECTRIC WATTHOUR METER

[75] Inventors: Warren R. Germer, Dover, N.H.; Maurice J. Ouellette, North Berwick, Me.

[73] Assignee: General Electric Company, Somersworth, N.H.

[21] Appl. No.: 944,029

[22] Filed: Dec. 22, 1986

[51] Int. Cl.$^4$ .................... G01R 21/133; G01R 15/08
[52] U.S. Cl. ..................................... 324/142; 324/116
[58] Field of Search .................. 324/78 D, 83 D, 116, 324/120, 990, 142, 115; 340/637; 364/483; 377/19, 20, 55, 111

[56] References Cited

U.S. PATENT DOCUMENTS

| | | | |
|---|---|---|---|
| 3,237,102 | 2/1966 | Newell | 324/115 |
| 3,728,524 | 4/1973 | Gray | 324/99 D |
| 3,792,352 | 2/1974 | Metcalf et al. | 324/99 D |
| 3,863,142 | 1/1975 | Werle | 324/115 |
| 3,947,763 | 3/1976 | Milkovic | 324/142 |
| 3,955,138 | 5/1976 | Milkovic | 324/107 |
| 4,087,796 | 5/1978 | Brown | 324/99 D |
| 4,309,692 | 1/1982 | Crosby | 324/99 D |
| 4,531,089 | 7/1985 | Ishizuka et al. | 324/99 D |
| 4,584,558 | 4/1986 | Maschek et al. | 324/115 |
| 4,585,957 | 4/1986 | Ooms | 377/111 |
| 4,598,270 | 7/1986 | Shutt et al. | 324/99 D |

Primary Examiner—Reinhard J. Eisenzopf
Assistant Examiner—William Burns
Attorney, Agent, or Firm—Robert E. Brunson; Thomas R. Morrison

[57] ABSTRACT

An auto-ranging circuit for an electronic watthour meter employs high- and low-range sources for increasing the dynamic range over which satisfactory measurement accuracy can be maintained. A counter, having a capacity equal to the ratio of high-range to low-range is interposed in the output during use of the low-range source so that output pulses have the same energy-consumption significance at all time. At transition from low-range to high-range, any residue in the counter, representing energy consumed but not yet recognized by the generation of an output pulse, is preset into an integrator of the electronic watthour meter for reducing correspondingly the amount of energy consumption required to produce an output pulse in the first measurement cycle following the low- to high-range transition.

7 Claims, 4 Drawing Sheets

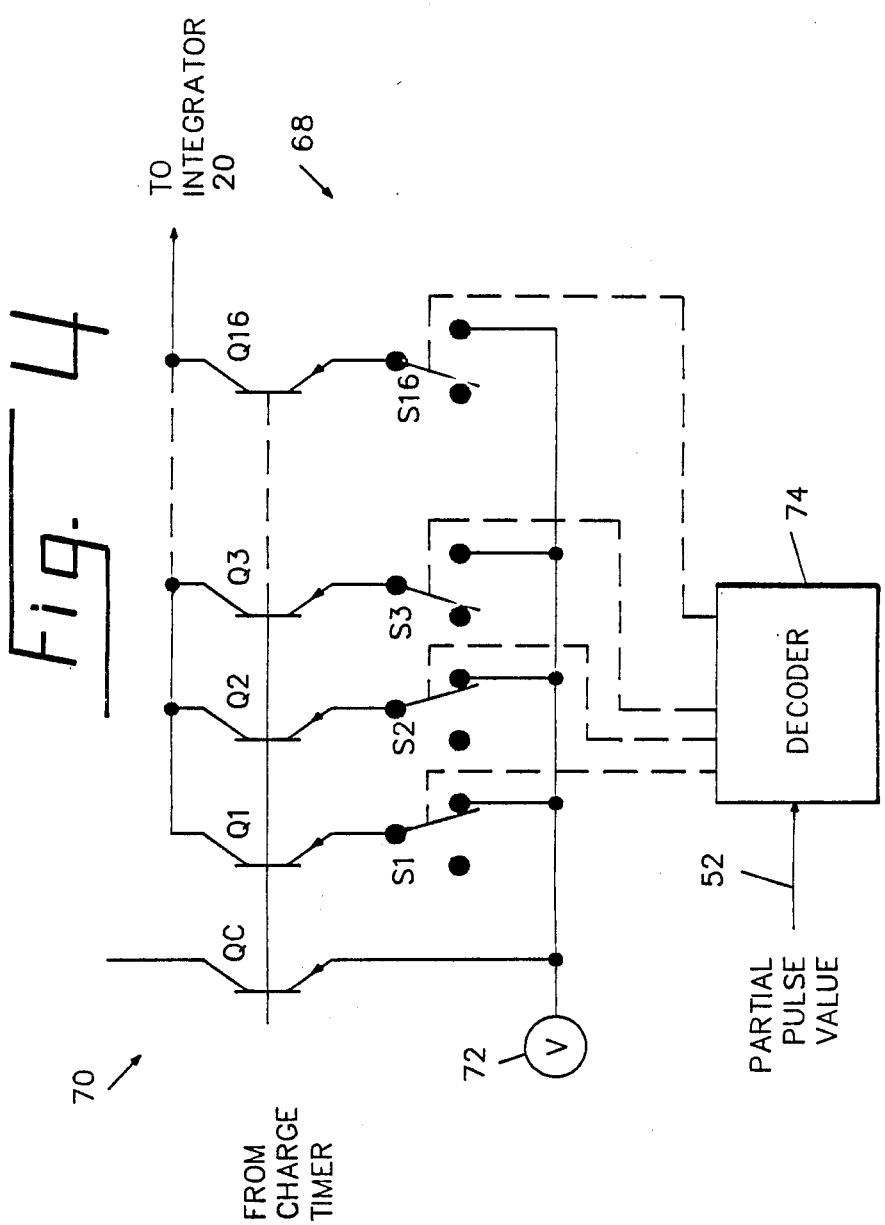

AUTO-RANGING IN ELECTRIC WATTHOUR METER

BACKGROUND OF THE INVENTION

The present invention relates to electric watthour meters and, more particularly, to techniques for improving the accuracy of measurement of electric watthour meters.

Electric watthour meters multiply a line voltage and load current to produce a quantity related to instantaneous power usage. The instantaneous power usage is integrated over time to accumulate energy consumed.

For many years, power usage was measured by rotation of a disk under the influence of magnetic fluxes and eddy currents produced by current and voltage stators. Integration was performed by coupling the rotation of the disk to a dial-type or cyclometer-type register.

In some watthour meters, measurement of a predetermined quantum of electric energy is denoted by the generation of a pulse. The pulses are accumulated over time to produce a measurement of the total amount of energy consumed. Such pulse-generating watthour devices are disclosed, for example, in U.S. Pat. Nos. 3,947,763 and 3,955,138.

All commercially acceptable watthour meters are required to maintain an accurate measurement of power usage over an extremely wide dynamic range. For example, a watthour meter rated at 30 amperes must continue to register with acceptable accuracy at 200 amperes and 3 amperes. Thus, a dynamic range of 66.7 (minimum to maximum) is required.

It is desired to increase the dynamic range over which acceptable metering accuracy may be maintained. A combination of electronic watthour metering using, for example, the techniques in the referenced patents, together with the teachings of the present disclosure, may provide such increased dynamic range.

OBJECTS AND SUMMARY OF THE INVENTION

It is an object of the invention to provide a watthour metering technique which overcomes the drawbacks of the prior art.

It is a further object of the invention to provide a watthour metering technique in which integration of power usage takes place at at least two different rates depending on the instantaneous level of power usage, and the generation of output pulses is adjusted to account for conditions existing at a time of change between rates.

Briefly stated, the present invention provides an auto-ranging circuit for an electronic watthour meter employing high- and low-range sources for increasing the dynamic range over which satisfactory measurement accuracy can be maintained. A counter, having a capacity equal to the ratio of high-range to low-range is interposed in the output during use of the low-range source so that output pulses have the same energy-consumption significance at all time. At transition from low-range to high-range, any residue in the counter, representing energy consumed but not yet recognized by the generation of an output pulse, is preset into an integrator of the electronic watthour meter for reducing correspondingly the amount of energy consumption required to produce an output pulse in the first measurement cycle following the low- to high-range transition.

According to an embodiment of the invention, there is provided a circuit for an electronic watthour meter, comprising: first means for producing a first signal in a first proportion to a power consumed by a load, second means for producing a second signal in a second proportion to the power consumed by the load, the second proportion having a predetermined ratio to the first proportion, range decision means for selecting the first signal when the power is less than a predetermined threshold and for selecting the second signal when the power is greater than the predetermined threshold, means for integrating a predetermined quantity of the selected one of the first and second signals and for producing a pulse in response thereto, means for reducing a significance of the pulse by the predetermined ratio during selection of the first signal, whereby an output pulse is generated having a constant significance, and means for changing an amount of power consumption required to produce a first output pulse following a transition from the first signal to the second signal in relation to a content of the means for reducing a significance at the time of the transition.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 4 is a simplified schematic diagram of a current-mirror circuit including means for varying a charging rate of a charge-balance integrator.

DETAILED DESCRIPTION OF THE PREFERRED EMBODIMENT

Figure 1:
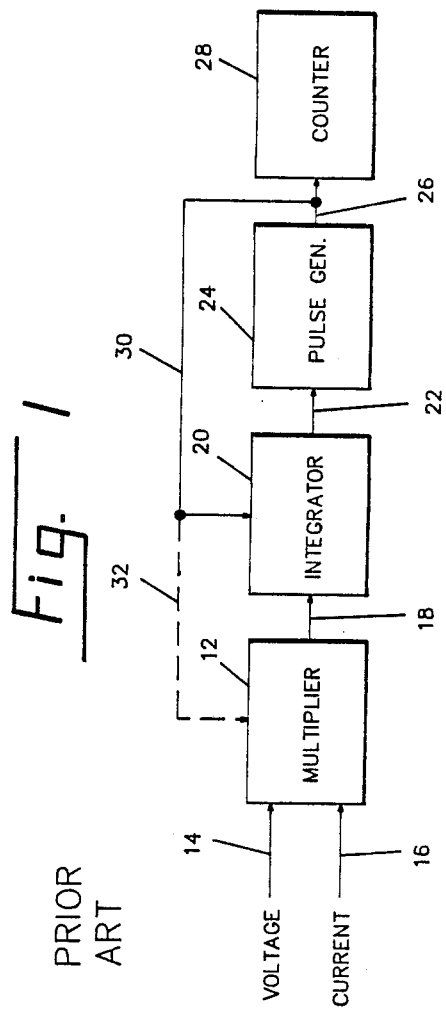
FIG. 1 is a simplified block diagram of an electronic watthour meter in which the present invention may be applied.

Referring now to FIG. 1, there is shown, generally at 10, a watthour meter which may be, for example, one of the types disclosed in the referenced U.S. Patents, the disclosures of which are herein incorporated by reference. In general, watthour meter 10 contains a multiplier 12 effective for multiplying a signal proportional to a line voltage, input on a line 14, with a signal proportional to a load current, input on a line 16, to produce a product signal proportional to instantaneous power consumption by a load (not shown).

In one type of multiplier 12, the current signal is pulse-width modulated with a pulse width proportional to the amplitude of the voltage signal to produce a pulse-width-modulated product signal having an amplitude proportional to current and a width proportional to voltage. Such a pulse-width-modulated signal is applied on a line 18 to an integrator 20. Integrator 20 integrates the product signal on line 18 to produce a triangular-wave signal on a line 22 for application to a pulse generator 24. A train of square-wave output pulses from pulse generator 24 is applied on a line 26 to a counter 28. Each square-wave output pulse from pulse generator 24 indicates the consumption of a predetermined quantum of electric energy such as, for example, 16 watthours.

As fully disclosed in the referenced U.S. Patents, pulse generator 24 includes, for example, a conventional threshold circuit (not shown separately) effective for monitoring the level of the integrated signal on line 22 and a conventional output (not shown in detail) effective for reversing the polarity of the square-wave output signal on line 26 each time the integrated signal level passes through predetermined positive and negative thresholds. In some of the prior-art devices, the output pulses on line 26 are fed back to integrator 20, as indicated by a line 30, for reversing the direction of integration during alternate pulse intervals. Such reversal of integration is effective for cancelling the effect of non-zero offset voltage in operational amplifiers (not shown) conventionally employed in integrator 20. Some of the prior-art devices also reverse the sense of the pulse widths of the pulse-width-modulated signal produced by multiplier 12 during alternate pulse intervals of the pulse signal on line 26, as indicated by a dashed line 32. Since the above techniques for multiplication and integration, as well as those for cancelling zero-offset voltages, are conventional and are not considered to represent an inventive part of the present disclosure, detailed discussion thereof is omitted.

As noted in the description of the background of the invention herein, the dynamic range requirements of watthour meter service are difficult to satisfy. One technique for improving the dynamic range of a watthour meter includes providing a plurality of ranges over which measurement is performed. In the apparatus of FIG. 1, for example, the signal proportional to current on line 16 may be derived from a selectable one of two current transformer windings. One of the current transformer windings being used to feed line 16 when the load current is in a low range and the other being used to feed line 16 when the load current is in a contiguous higher range. Watthour meter 10 continues to operate, completely unaware that its current signal is increased or decreased by a fixed factor. Thus, the range over which satisfactory measurement accuracy is attainable is increased.

When the sensitivity of the apparatus feeding line 16 is changed by a fixed factor, the amount of energy usage signified by each watthour pulse produced by pulse generator 24 is varied in an inverse ratio. For example, if the ratio of the current signal on line 16 to the load current required to produce a given value of the current signal on line 16 is reduced by a factor of sixteen in going from the low-current range to the high-current range, then each pulse produced by pulse generator 24 represents sixteen times as much energy consumption as it did in the low-current range. To use a numeric example, if 16 watt hours of energy produce one output pulse in the high-current range, after switching to the low-current range, one output pulse is produced for each watt hour.

Some means must be provided for changing the significance of the output pulses in dependence on the input current range. That is, each output pulse from pulse generator 24 must signify consumption of the same quantum of electric energy in both current ranges. One technique for accomplishing this employs a counter switched in during low-current operation to reduce the number of output pulses from pulse generator 24 in the inverse ratio to the ratio of high-current to low-current ranges. For example, if the range ratio is 16, then the counter counts 16 pulses from pulse generator 24 before producing each output pulse on line 26 in the low-current range. The counter is bypassed in the high-current range.

A problem occurs in the transition from low-current to high-current range. At the time that a transition from low- to high-current ranges is needed, the existing contents of the counter, representing billing data of economic value to the utility providing the electricity, must somehow be accounted for. One possibility is to hold the contents of the counter until the next time that low-range current exists and then resume counting until the stored value plus new values are sufficient to produce an output pulse. Although this technique accounts eventually for all quanta of electric energy consumed, it loses track of the time during which the low-current energy is consumed. In time-of-day metering systems, the billing rate differs over different periods during a day, week, month or year. A partial count may be stored in the counter during a period covered by one billing rate and not recognized by its contribution to an output pulse until a different billing rate is in effect. Thus, the energy consumer may pay more or less for the electricity represented by the stored partial count than is provided for by the governing tariffs. In demand metering, such storage of a partial count for later recognition may shift an increment of demand from one demand interval to another, thus distorting the maximum demand reading for both of the affected demand intervals.

The partial-count problem does not occur in the transition from high- to low-current range since, in the example apparatus suggested above, the counter is bypassed in the high-current range. A partial integration under way at the time that the threshold between high- and low-current ranges is crossed is preferably completed before performing the switch between ranges and inserting the counter in the output chain. This can be accomplished by delaying the range and counter switching to coincide with the appearance of an output pulse on line 26.

Figure 2:
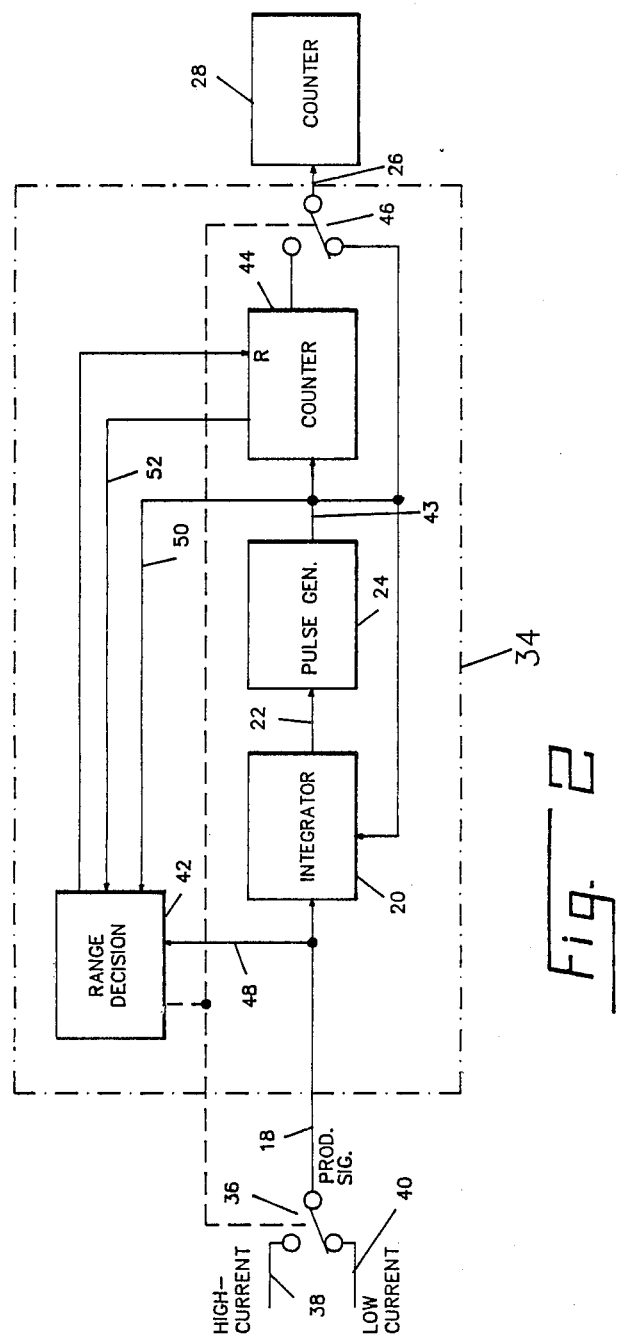
FIG. 2 is a simplified block diagram of an integrator and pulse generator according to an embodiment of the invention.

Referring now to FIG. 2, an integrator and pulse generator 34 is shown according to one embodiment of the invention. A product signal is available to a switch 36 selectably from a high-power (high-current) sensor on a line 38 and a low-power (low-current) sensor on a line 40.

One skilled in the art will recognize that high current and high power (or low current and low power) are only interchangeable at unity power factor. However, description of the present invention is simplified by such an assumption. When power factors differing from unity are taken into account, it may be necessary to perform corresponding processing of the resistive and reactive components of power. Since these details are well known to those skilled in the art, it is deemed appropriate to omit further description thereof.

It should be understood that switch 36 is conceptual only to indicate the availability of high- and low-current product signals. The exact manner in which such high- and low-current signals are generated may vary from one embodiment to the other. The important concept is the ability to switch between sources. In the referenced patents, for example, different current transformers may be connected selectably to the input of multiplier 12 (FIG. 1). In another technique, one or the other of a pair of secondary windings on a common current transformer is selected to provide high- or low-current scaling. In a further embodiment, a current transformer with a single primary winding and multiple secondary windings may be provided for scaling current in low and in high ranges. In a further embodiment, an active secondary system may keep a current flowing in a selected one of a plurality of auxiliary secondary windings sufficient to maintain the magnetic flux in the transformer core at close to zero, whereby magnetic saturation of the core is avoided. One such technique is disclosed in U.S. patent application Ser. No. (Attorney's Docket No. 11-ME-181) having the same filing date as the present application, and whose disclosure is herein incorporated by reference as containing non-critical material useful to enhance an understanding of the present invention.

As can be gathered from the preceding, some technique is necessary for providing scaling of a signal according to the magnitude of instantaneous power consumption (or, as is commonly analogous, to the magnitude of load current). The exact manner in which such scaling is performed is not of concern to The selected product signal, in the specific embodiment of FIG. 2 is applied on line 18 to integrator 20 and on a line 48 to a range decision circuit 42. As is conventional, integrator 20 integrates the product signal on line 18 toward a first threshold in pulse generator 24. Upon the value of the integrated signal fed on line 22 reaching the first threshold, the pulse signal on a line 43 changes from its first to its second condition. The first condition may be, for example, a positive voltage and the second condition may be a negative voltage of the same absolute value as the first condition. The pulse signal is fed back on line 30 to integrator 20. Upon the pulse signal reversing its condition, integrator 20 begins integrating in the opposite direction until its integrated output reaches the second threshold in pulse generator 24, whereupon the process repeats. In addition to the activity taking place in integrator and pulse generator 34, some embodiments of the invention employ the change of condition of the pulse signal on line 43 to change the operating condition of multiplier 12 (FIG. 1) so that the sense of the product signal agrees with the direction in which integration is performed. Such control of the operating condition of multiplier 12 is conventional and is fully detailed in the referenced patents.

Besides being fed to integrator 20, the pulse signal is also fed to inputs of range decision circuit 42, a counter circuit 44, and one input of an output switch 46. The output of counter circuit 44 is fed to a second input of output switch 46. The output of output switch 46 is fed on line 26 to counter 28. Counter circuit 44 produces one output pulse upon receipt of a predetermined number of input pulses. Although the specific number of such pulses may vary for different applications and should not be considered to be limiting, for purposes of concreteness, counter circuit 44 is assumed to produce one output pulse for each sixteen input pulses. Thus, counter circuit 44 acts as a sixteen-to-one divider.

It will be clear to one skilled in the art that, when output switch 46 is in the condition shown, each sixteen pulses are required from pulse generator 24 to produce one pulse from counter circuit 44 applied to counter 28. When output switch 46 is in its alternate position, sixteen pulses are required from pulse generator 24 to produce one pulse from counter circuit 44 applied to counter 28.

Switches 36 and 46 are ganged for concerted operation by range decision circuit 42. Thus, when range decision circuit 42 applies a high-power (or current) source through switch 36 to integrator 20, it actuates output switch 46 to apply the output of pulse generator 24 directly to counter 28 without intermediate division. On the contrary, in their alternate positions, employed during low-power (or current) operation, output switch 46 selects the divided output of counter circuit 44 for application to counter 28. Assuming that the significance of the power or current ratio selected by the alternate positions of switch 36 agrees with the division provided by counter circuit 44, then the occurrence of each output pulse signifies the consumption of an identical amount of electrical energy under all conditions.

Range decision circuit 42 performs the decision for switching between high- and low-power ranges based on the instantaneous value of consumption or load current. Sensing for determining the instant of switching may be based on suitable signals anywhere in the apparatus. One situs for obtaining a signal for monitoring the power consumption may be, for example, the selected product signal on line 18. A line 48 may conduct the pulse-width-modulated product signal from line 18 to an input of range decision circuit 42. Suitable conventional circuits in range decision circuit 42 (not shown) are employed for determining the instantaneous power consumption and performing the switching based on a set of logic rules.

Power consumption may be sensed in any convenient location besides the location indicated. For example, the current sample produced by the active winding of a multi-winding current transformer may be monitored by range decision circuit 42. Regardless the point at which the input is derived, the signal to range decision circuit 42 is employed to determine that a threshold is crossed from high to low power (or current) when in the high range, or from low to high when in the low range. As would be understood by one skilled in the art, an appropriate amount of hysteresis may be applied to the threshold to avoid dithering between ranges while power consumption lies close to the threshold.

As noted in the foregoing, when performing the high-to-low power transition, partial-count residues may be avoided by delaying the transition to coincide with an output pulse from pulse generator 24. For this purpose, a line 50 is connected from line 43 to range decision circuit 42.

When performing the low-to-high transition, any partial count in counter circuit 44 must be accounted for. The count in counter circuit 44 is transmitted to range decision circuit 42 on a line 52. A reset signal is transmitted from range decision circuit 42 to a reset input R of counter circuit 44 to reset the contents of counter circuit 44 to a known starting condition such as, for example, zero, in preparation for continued operation. The acceptance of the partial count and the generation of the reset signal may be delayed to coincide with a pulse from pulse generator 24.

The partial count in counter circuit 44, transmitted to range decision circuit 42, is employed to modify or shorten the length of time required for the generation of the first output pulse in the high-power mode. Several techniques for performing such modification are detailed in the following paragraphs.

Figure 3:
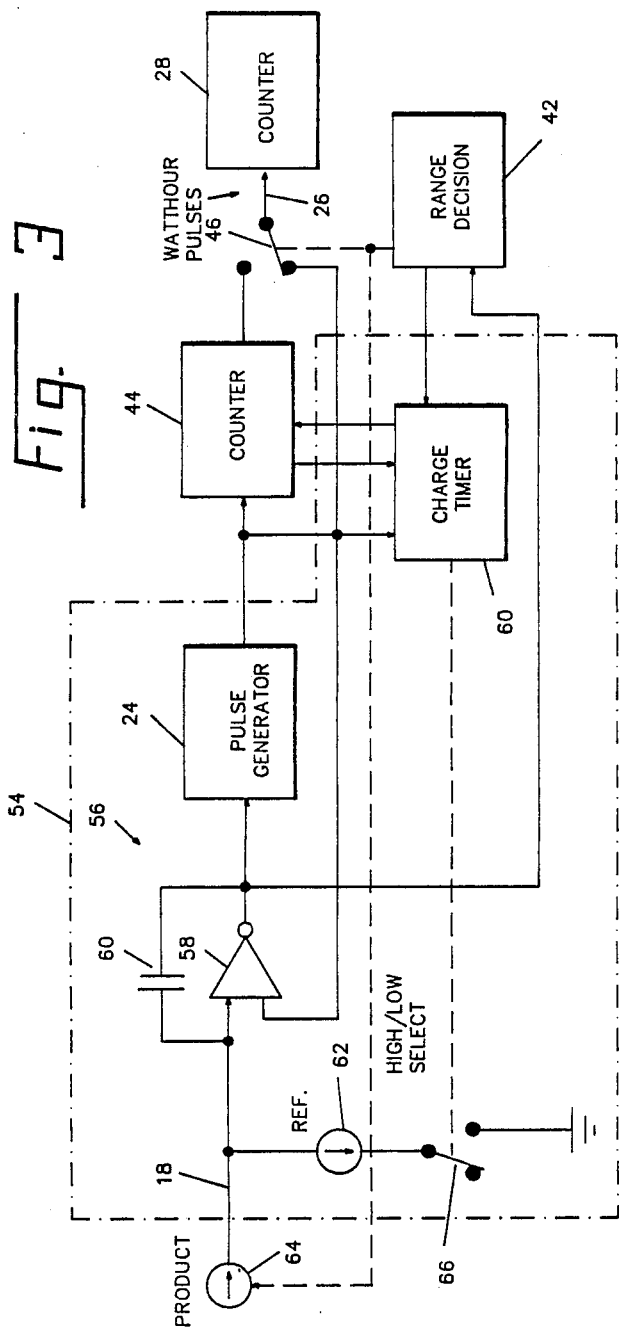
FIG. 3 is a simplified block diagram showing one apparatus for reducing the amount of charge in a charge balance integrator in accordance with a residue in a counter.

Referring now to FIG. 3, a charge-balance integrator 54 includes an integrator 56 consisting of an operational amplifier 58 with an integrating capacitor 60 connected between input and output. A constant-current source 62 is connected to an input of operational amplifier 58, together with the product signal, whose source is represented by a product-signal current source 64. A terminal of constant-current source 62 is connected to a charging switch 66. A second terminal of charging switch 66 is open. A charge timer 68 periodically closes charging switch 66 for a predetermined time period to inject a predetermined quantum of charge into integrating capacitor 60. Thereafter, the product signal on line 18 discharges the charge in integrating capacitor 60 until the output voltage from integrator 56 reaches a threshold. Thereupon, charge timer 68 again closes charging switch 66 to begin another integration cycle.

In the low-to-high-range transition enabled by range decision circuit 42, the time during which charge timer 68 keeps charging switch 66 in the closed condition for charging integrating capacitor 60 prior to the first integration cycle after the transition is reduced in accordance with the size of the count then contained in counter circuit 44. For example, if counter circuit 44 contains a count of 8 when the transition is required, the amount of time that charge timer 68 holds charging switch 66 in the closed position is reduced to half that in a normal cycle. Thus, only half as much charge from product-signal current source 64 is required to discharge integrating capacitor 60 to a value effective to trigger an output pulse as is required when integrating capacitor 60 is charged with a full-length charging pulse. In the extreme case, a count of fifteen is contained in counter circuit 44 at the time the low-to-high transition occurs. Charge timer 68 holds charging switch 66 closed for only one-sixteenth the normal charging time. Thus, product-signal current source 64 is required to produce only one-sixteenth as much charge to produce an output pulse as is normally needed.

Charge timer 68 may contain, for example, a four-bit counter and a clock generator, together with suitable conventional gating and flip-flop circuits. A flip-flop may produce the charging signal while the counter is driven by pulses from the clock generator. In normal charging, the flip-flop may be gated to produce the charging signal while the counter is cycled from zero to 16. In low-to-high transition charging, the four-bit counter may be preset with a value equal to that existing in counter circuit 44. Thus, the four-bit counter in charge timer 68 reaches 16 in a time that is reduced in proportion to the value existing in counter circuit 44 at the instant that the range transition is performed.

The shortened charging time is employed only once following the low-to-high transition. At all other times, a full charging cycle is used.

Other techniques besides varying the charging time in a charge balance integrator may be employed without departing from the spirit and scope of the invention.

Referring now to FIG. 4, an embodiment of the invention is shown wherein the amount of precharge delivered to integrator 56 in a fixed charging time is varied. A current-mirror circuit 70 includes a control transistor QC and plurality of charging transistors Q1-Q16, all having their bases connected together. An emitter of control transistor QC is connected to a voltage source V 72. The emitters of charging transistors Q1-Q16 are connected to charging switches S1-S16, respectively. Second terminals of charging switches S1-S16 are connected to voltage. source V 72. A decoder 74, receiving the four-bit contents of counter circuit 44 on line 52, produces sixteen control signals corresponding thereto for controlling the conditions of charging switches S1-S16.

As is well known, a current-mirror circuit consists of a single control transistor producing a current in a single controlled transistor equal to the current in the control transistor. In its common embodiment, the two transistors of a current-mirror circuit have their bases and emitters in parallel with each other. A signal applied between the base and emitter of the controlling transistor produces a current therein. Since the base and emitter of the controlled transistor are in parallel with corresponding elements of the controlling transistor, a current is induced in the controlled transistor related to the current in the controlling transistor by the parameters of the two transistors. If the transistor parameters are substantially equal, then the currents are also substantially equal, hence the name current-mirror circuit. In the embodiment of the invention in FIG. 4, each of charging transistors Q1-Q16 has parameters substantially equal to those of control transistor QC. Each of charging transistors Q1-Q16, when enabled by closing of its related charging switch S1-S16, conducts a current substantially equal to that in control transistor QC. Thus, sixteen values of charging current can be connected to integrator 20 during a fixed-length charging cycle.

Under-normal conditions, all of charging switches S1-S16 are closed. Thus, during a charging cycle, current-mirror circuit 70 delivers a charge to integrator 20 equal to 16 times the charge passing through control transistor QC. In preparation for the first charging cycle following a low-to-high transition, decoder 74 is enabled to open a number of charging switches S1-S16 according to the contents of counter circuit 44 (FIG. 3) at the time the transition occurs. That is, if counter circuit 44 contains the count of 8 (decimal) at the time of transition, charging switches S1-S8 may be closed, whereby only half as much charging current is applied through current-mirror circuit 70 to integrator 20 as in a normal charging cycle. Similarly, if the count in counter circuit 44 is 15, only charging switch S1 is closed, whereby only one-sixteenth as much charging current is required from the load current before an output pulse is generated.

The 17-transistor and 16-switch structure of FIG. 4 is of relatively low cost when produced in a single integrated circuit. In addition, when all of transistors Qc and Q1-Q16 are produced in the same processing steps in a single integrated circuit, their parameters are more closely matched than if formed on separate devices. Furthermore, all elements on an integrated circuit are exposed to substantially the same power supply and temperature. Thus, even in the presence of changing power supply and temperature, the ratio of currents, as selected by charging switches S1-S16, remains the same.

One skilled in the art will recognize that current-mirror circuit 70, employing seventeen transistors and sixteen switches, could be replaced by a smaller number of components if desired. The current-carrying capability of a transistor is generally related to the cross-sectional area of its conducting region. The cross-sectional areas of the charging transistors may be varied to produce different charging currents. For example, four transistors (not shown) could be used with binary increasing values. That is, four transistors may be provided having current-carrying ratios of 1, 2, 4 and 8, relative to the current in charging transistor QC. Thus, the four-bit contents of counter circuit 44 (FIG. 3) could be applied directly to corresponding charging switches. A similar result could be accomplished by ganging sixteen charging transistors in four binary-related sets with each set controlled by a single charging switch. That is, one set may contain a single charging transistor, controlled by a first charging switch, a second set may contain a pair of charging transistors controlled by a second charging switch, a third set may contain four transistors controlled by a third charging switch, and the fourth set may contain eight transistors controlled by a fourth charging switch. In such an embodiment, the function of decoder 74 is not required; the charging switches may be directly controlled by the partial pulse value stored in counter circuit 44 at the time of the transition.

Further techniques for accounting for a partial output pulse at a low-to-high transition will occur to one skilled in the art. For example, instead of employing parallel transistors switched by charging switches in a current-mirror circuit, as in the embodiment of FIG. 4, an unchanging number of charging transistors may be employed in an embodiment in which the voltage provided by voltage source V 72 varies according to the partial-pulse value existing at the time of transition. For example, voltage source V 72 may contain a constant-voltage source feeding a resistive ladder voltage divider. The voltage employed at any time is selected according to the charging current desired.

It should not be considered that the present invention is limited to use in connection with a charge-balance integrator. Other types of integrators may be employed without departing from the spirit and scope of the invention.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What we claim is:

1. A circuit for an electronic watthour meter, comprising:
   first means for producing a first signal in a first proportion to a power consumed by a load;
   second means for producing a second signal in a second proportion to said power consumed by said load;
   said second proportion having a predetermined ratio to said first proportion;
   range decision means for selecting said first signal when said power is less than a predetermined threshold and for selecting said second signal when said power is greater than said predetermined threshold;
   means for integrating a predetermined quantity of the selected one of said first and second signals and for producing a pulse in response thereto;
   means for reducing a significance of said pulse by said predetermined ratio during selection of said first signal, whereby an output pulse is generated having a constant significance; and
   means for changing an amount of power consumption required to produce a first output pulse following a transition from said first signal to said second signal dependent upon a content of said means for integrating at the time of said transition.

2. A circuit for an electronic watthour meter, comprising:
   first means for producing a first signal in a first proportion to a power consumed by a load;
   second means for producing a second signal in a second proportion to said power consumed by said load;
   said second proportion having a predetermined ratio to said first proportion;
   range decision means for selecting said first signal when said power is less than a predetermined threshold and for selecting said second signal when said power is greater than said predetermined threshold;
   means for integrating a predetermined quantity of the selected one of said first and second signals and for producing a pulse in response thereto;
   means for reducing a significance of said pulse by said predetermined ratio during selection of said first signal, whereby an output pulse is generated having a constant significance; and
   means for changing an amount of power consumption required to produce a first output pulse following a transition from said first signal to said second signal in relation to a content of said means for integrating at the time of said transition;
   said means for integrating is a charge balance integrator; and
   said means for changing an amount of power includes means for reducing an amount of charge in said charge balance integrator in relation to said content, whereby a reduced amount of charge is required from said second signal to produce an output pulse.

3. A circuit according to claim 2 wherein said means for reducing an amount of charge includes means for reducing a charging time.

4. A circuit according to claim 3 wherein said means for reducing a charging time includes:
   a charge timer;
   said charge timer being effective for controlling a charging of said charge balance integrator; and
   means for controlling a period of said charging time in relation to said content.

5. A circuit according to claim 2 wherein said means for reducing an amount of charge includes means for reducing a charging rate.

6. A circuit according to claim 5 wherein said means for reducing a charging rate includes:
   a current-mirror circuit;
   a control transistor and at least first and second charging transistors in said current-mirror circuit; and
   means for selectively enabling said at least first and second charging resistors, whereby said charging rate is controlled.

7. A circuit according to claim 6 wherein:
   said means for selectively enabling includes at least first and second charging switches connected for enabling said at least first and second charging transistors; and
   means for controlling said at least first and second charging switches.

* * * * *